United States Patent
Hill et al.

(10) Patent No.: US 9,466,741 B2
(45) Date of Patent: Oct. 11, 2016

(54) DIGITAL ALLOY ABSORBER FOR PHOTODETECTORS

(75) Inventors: Cory J. Hill, Pasadena, CA (US); David Z. Ting, Arcadia, CA (US); Sarath D. Gunapala, Stevenson Ranch, CA (US)

(73) Assignee: California Institute of Technology, Pasadena, CA (US)

( * ) Notice: Subject to any disclaimer, the term of this patent is extended or adjusted under 35 U.S.C. 154(b) by 792 days.

(21) Appl. No.: 12/639,913

(22) Filed: Dec. 16, 2009

(65) Prior Publication Data
US 2010/0155777 A1    Jun. 24, 2010

Related U.S. Application Data

(60) Provisional application No. 61/201,849, filed on Dec. 16, 2008.

(51) Int. Cl.
*H01L 31/0304* (2006.01)
*H01L 31/101* (2006.01)

(52) U.S. Cl.
CPC ....... *H01L 31/03046* (2013.01); *H01L 31/101* (2013.01); *Y02E 10/544* (2013.01)

(58) Field of Classification Search
CPC .................. H01L 31/035236; H01L 31/1035; H01L 27/14649; H01L 21/02466; H01L 21/02505; H01L 21/02549; H01L 31/1013; H01L 31/184
USPC ......... 257/184, 189, 190, E33.002, E31.022; 438/56, 73
See application file for complete search history.

(56) References Cited

U.S. PATENT DOCUMENTS 5,479,032 A    12/1995   Forrest et al.
5,625,635 A *   4/1997   Kurtz et al. ............. 372/45.011
(Continued)

FOREIGN PATENT DOCUMENTS

| WO | WO 2005/004243 | 1/2005 |
| WO | WO 2007/113821 | 10/2007 |
| WO | WO 2008/061141 | 5/2008 |

OTHER PUBLICATIONS

Maimon et al., "nBn detector, an infrared detector with reduced dark current and higher operating temperature," App. Phys. Letters 89, 151109, 2006.
Shao et al., "Room-Temperature p-n-p. AlGaAsSb—InGaAsSb Heterojunction Phototransistors With Cutoff Wavelength at 2.5 µm," IEEE Ph. Tech. Letters, vol. 18, No. 22, Nov. 15, 2006.
(Continued)

*Primary Examiner* — Marc Armand
*Assistant Examiner* — Sue Tang
(74) *Attorney, Agent, or Firm* — Canady & Lortz LLP; Bradley K. Lortz

(57) ABSTRACT

In order to increase the spectral response range and improve the mobility of the photo-generated carriers (e.g. in an nBn photodetector), a digital alloy absorber may be employed by embedding one (or fraction thereof) to several monolayers of a semiconductor material (insert layers) periodically into a different host semiconductor material of the absorber layer. The semiconductor material of the insert layer and the host semiconductor materials may have lattice constants that are substantially mismatched. For example, this may performed by periodically embedding monolayers of InSb into an InAsSb host as the absorption region to extend the cutoff wavelength of InAsSb photodetectors, such as InAsSb based nBn devices. The described technique allows for simultaneous control of alloy composition and net strain, which are both key parameters for the photodetector operation.

20 Claims, 9 Drawing Sheets

(56) References Cited

U.S. PATENT DOCUMENTS

| | | | |
|---|---|---|---|
| 5,760,925 A * | 6/1998 | Saund et al. | 358/497 |
| 2002/0140012 A1* | 10/2002 | Droopad | 257/295 |
| 2007/0090337 A1* | 4/2007 | Ueno et al. | 257/13 |
| 2007/0215900 A1 | 9/2007 | Maimon | |
| 2007/0235758 A1* | 10/2007 | Klipstein | 257/188 |
| 2008/0111152 A1* | 5/2008 | Scott | H01L 27/14603 257/188 |

OTHER PUBLICATIONS

Klipstein, "'XBn' Barrier Photodetectors for High Sensitivity and High Operating Temperature Infrared Sensors," Proc. of SPIE, vol. 6940, 69402U, 2008.

Mikhailova, "Type II heterojunctions in the GaInAsSb/GaSb system," Semicond. Sci. Technol., 9, 1994, 1279-1295, UK.

Rodriguez et al., "nBn Structure based on InAs/GaSb Type-II strained layer superlattices," Appl. Phys. Letters, 91, 043514. 2007.

* cited by examiner

DIGITAL ALLOY ABSORBER FOR PHOTODETECTORS

CROSS-REFERENCE TO RELATED APPLICATIONS

This application claims the benefit under 35 U.S.C. §119 (e) of the following U.S. provisional patent application, which is incorporated by reference herein:

U.S. Provisional Patent Application No. 61/201,849, filed Dec. 16, 2008, and entitled "DIGITAL ALLOY METHOD FOR IMPROVED NBN DETECTORS", by Hill et al.

This application is related to U.S. patent application Ser. No. 12/567,635, filed Sep. 25, 2009 by Ting et al., and entitled "HIGH OPERATING TEMPERATURE BARRIER INFRARED DETECTOR WITH TAILORABLE CUTOFF WAVELENGTH," which is incorporated by reference herein.

STATEMENT OF GOVERNMENT RIGHTS

The invention described herein was made in the performance of work under a NASA contract, and is subject to the provisions of Public Law 96-517 (35 USC 202) in which the Contractor has elected to retain title.

BACKGROUND OF THE INVENTION

1. Field of the Invention

This invention relates to photodetectors. Particularly, this invention relates to digital alloy absorber layers for infrared photodetectors.

2. Description of the Related Art

Photodectors are electro optical devices that respond to incident light. They have a wide range of applications, including imaging. One class of photodectors operates in the infrared light range. Such devices have applications in infrared imaging including planetary exploration, industrial quality control, monitoring pollution, firefighting, law enforcement, and medical diagnosis.

In conventional semiconductor p-n junction photodetectors, the depletion layer at the junction impedes the flow of the majority carriers across the junction, while allowing the minority carriers to flow freely. Although the depletion layer enhances detector performance in this manner, it also introduces Shockley-Read-Hall (SRH) dark currents which introduce noise. The resulting dark current limits the operating temperature. However in recent years, a newly developed class of infrared photodectors has been employing an embedded barrier layer to suppress SRH currents, as well as surface leakage currents.

The barrier infrared photodetector concept is described in U.S Patent Application Publication No. 2007/0215900, published Sep. 20, 2007, by Maimon, which is incorporated by reference herein and discloses a photo-detector comprising a photo absorbing layer comprising an n-doped semiconductor exhibiting a valence band energy level, a barrier layer, a first side of the barrier layer adjacent a first side of the photo absorbing layer, the barrier layer exhibiting a valence band energy level substantially equal to the valence band energy level of the doped semiconductor of the photo absorbing layer, and a contact area comprising a doped semiconductor, the contact area being adjacent a second side of the barrier layer opposing the first side, the barrier layer exhibiting a thickness and a conductance band gap sufficient to prevent tunneling of majority carriers from the photo absorbing layer to the contact area and block the flow of thermalized majority carriers from the photo absorbing layer to the contact area. Alternatively, a p-doped semiconductor may be utilized, and conductance band energy levels of the barrier and photo absorbing layers are equalized.

Further discussion of the operation of a barrier infrared photodetector may be found in Klipstein, "'XBn' Barrier Photodetectors for High Sensitivity and High Operating Temperature Infrared Sensors," Infrared Technology and Applications XXXIV, Proc. of SPIE Vol. 6940, 69402U, 2008, which is incorporated by reference herein. The article describes a barrier photodetector is a device in which the light is absorbed in a narrow bandgap semiconductor layer whose bands remain essentially flat or accumulated at the operating bias so that all carrier depletion is excluded. In a conventional photodiode below a threshold temperature, typically 130-150K for mid-wave infrared (MWIR) devices, the dark current is due to Generation-Recombination (G-R) centers in the depletion layer. In a barrier detector, the absence of depletion in the narrow bandgap semiconductor ensures that the G-R contribution to the dark current is negligible. The dark current in the barrier detector is thus dominated by the diffusion component, both above and below the threshold temperature. Therefore, at a given temperature below the threshold temperature, a barrier detector will exhibit a lower dark current than a conventional photodiode with the same cut-off wavelength. Alternatively, for a given dark current, a barrier detector will operate at a higher temperature than a conventional photodiode, provided that this temperature is below the threshold temperature. Some device architectures are presented for barrier detectors with photon absorbing layers based on $InAs_{1-x}Sb_x$ alloys and type-II InAs/GaSb superlattices (T2SL). The thermionic and tunneling components of the dark current are analyzed and shown to be negligible for typical device parameters. An operating temperature of ~150K may be estimated for a MWIR barrier detector with f/3 optics and a cut-off wavelength of 4.2 microns.

In addition, International Patent Publication No. WO 2005/004243, published Jan. 13, 2005, by Klipstein, describes a photodetector with a reduced G-R noise, which comprises a sequence of a p-type contact layer, a middle barrier layer and an n-type photon absorbing layer, wherein the middle barrier layer has an energy bandgap significantly greater than that of the photon absorbing layer, and there is no layer with a narrower bandgap than that in the photon-absorbing layer.

Further, International Patent Publication No. WO 2007/113821, published Oct. 11, 2007, by Klipstein, describes a photodetector with a reduced G-R noise, which comprises two n-type narrow bandgap layers surrounding a middle barrier layer having an energy bandgap at least equal to the sum of the bandgaps of said two narrow bandgap layers, wherein under flat band conditions the conduction band edge of each narrow bandgap layer lies below the conduction band edge of the barrier layer by at least the bandgap energy of the other narrow bandgap layer and wherein, when biased with an externally applied voltage, the more negatively biased narrow bandgap layer is the contact layer and the more positively biased narrow bandgap layer is the photon abosorbing layer, and wherein under external bias conditions the bands in the photon absorbing layer next to the barrier layer are flat or accumulated, and the flat part of the valence band edge in the photon absorbing layer lies below the flat part of the valence band edge of the contact layer and it also lies an energy of not more than 10kTop above the valence band edge in any part of the barrier layer, where k is the Boltzman constant and Top is the operating temperature.

International Patent Application Publication No. WO 2008/061141 by Caine et al., published May 2008 and incorporated by reference herein, describes a method of making a two-dimensional detector array (and of such an array) comprising, for each of a plurality of rows and a plurality of columns of individual detectors, forming an n-doped semiconductor photo absorbing layer, forming a barrier layer comprising one or more of AlSb, AlAsSb, AlGaAsSb, AlPSb, AlGaPSb, and HgZnTe, and forming an n-doped semiconductor contact area.

However, specific designs of barrier photodetectors with high performance can be difficult to develop. The combination of barrier layer and absorber must be carefully selected to yield optimal results. Building an nBn or XBn infrared detector requires a matching pair of absorber and barrier materials with the following properties: (1) their valence band edges ($E_v$) must be approximately the same to allow unimpeded hole flow, while their conduction band edges ($E_c$) should have a large difference to form an electron barrier, (2) they must have substantially similar lattice constants, and (3) their lattice constants should also match closely to that of a readily available semiconductor substrate material that they are grown on in order to ensure high material quality and low defect density.

The lattice matching to substrate requirement is particularly important for the absorber material, because of the need to grow a thick absorber layer, typically a few microns, for high absorption quantum efficiency. The barrier is typically only a few hundred nanometers in thickness, and therefore can tolerate only a small amount of lattice-mismatching to the substrate material without suffering degradation in the barrier material quality. Because of this set of stringent requirements, initially the nBn detector was implemented with success only in a single material system, using an InAsSb infrared absorber that is lattice-matched to GaSb substrate, and an AlSbAs barrier with a matching valence band edge. The approximate composition of the lattice matched InAsSb ternary alloy is $InAs_{0.91}Sb_{0.09}$. The limitation of this implementation is that the absorber material, and hence the infrared detector made from it, has a fixed cutoff wavelength, at approximately 4.1 µm when measured at 150K.

Particular applications may require an infrared detector having a specific cutoff wavelength. In addition, it is especially desirable to have photodetectors with a cutoff wavelength of at least 5 µm for applications operating within the known atmospheric transmission window of 3 to 5 µm wavelengths.

Some newer nBn photodetectors designs employ an bi-layer superlattice absorber comprising two different semiconductor materials (e.g. GaSb and InAs) which are both lattice matched to the substrate and employed with substantially equal thickness, having substantially similar lattice constants (and therefore lattice matched to one another as well). The InAs/GaSb type-II superlattice is a well-established infrared material, with absorption cutoff wavelength that can be customized. Cutoff wavelengths ranging from below 2 µm to over 30 µm have been demonstrated. For example, Rodriguez et al., "nBn structure based on InAs/GaSb type-II strained layer superlattices," Appl. Phys. Letters, 91, 043514, 2007, disclose a type-II InAs/GaSb strained layer superlattice photodetector using an nBn design that can be used to eliminate both Shockley-Read-Hall generation currents and surface recombination currents, leading to a higher operating temperature. The strained layer superlattice photodetector based structure is presented with a cutoff wavelength of 5.2 µM at room temperature. Processed devices exhibited a quantum efficiency around 18%, and a shot-noise-limited specific detectivity ~$10^9$ Jones at 4.5 µm and 300 K, which are comparable to the state of the art values reported for p-i-n photodiodes based on strained layer superlattices.

In view of the foregoing, there is a need in the art for apparatuses and methods for improved barrier infrared detectors that operate with short- to mid-wavelength infrared light, e.g. approximately 1 to 5 µm. There is particularly a need for such apparatuses and methods to operate up to 5 µm wavelength in order to match the atmospheric transmission window of 3 to 5 µm. There is a need for such apparatuses and methods to operate with improved carrier transport properties. There is further a need for such apparatuses and methods to operate having a tailorable cutoff wavelength. These and other needs are met by embodiments of the present invention as detailed hereafter.

SUMMARY OF THE INVENTION

In order to increase the spectral response range and improve the mobility of the photo-generated carriers (e.g. in an nBn photodetector), a digital alloy absorber may be employed by embedding one (or fraction thereof) to several monolayers of a semiconductor material (insert layers) periodically into a different host semiconductor material of the absorber layer. The semiconductor material of the insert layer and the host semiconductor materials may have lattice constants that are substantially mismatched. (In contrast to the InAs/GaSb type-II superlattice, where InAs and GaSb have substantially similar lattice constants.) For example, this may performed by periodically embedding monolayers of InSb into an InAsSb host as the absorption region to extend the cutoff wavelength of InAsSb photodetectors, such as InAsSb based nBn devices. The described technique allows for simultaneous control of alloy composition and net strain, which are both key parameters for the photodetector operation.

A typical embodiment of the invention comprises an absorber layer for a photodetector, including a host semiconductor material grown as a plurality of host layers, and an insert semiconductor material periodically inserted as a plurality of insert layers interleaved with at least some of the plurality of host layers each having a host separation thickness therebetween as the host semiconductor material is grown, each of the plurality of insert layers having an insert thickness. The insert thickness is two monolayers or less (e.g. typically 4 Angstroms or less) and significantly less than the host separation thickness. The host semiconductor material and the insert semiconductor material may have substantially mismatched lattice constants. Typically, the plurality of insert layers are periodically inserted into the host semiconductor material to reduce a bandgap of the absorber layer. The photodetector may comprise a barrier photodetector. In addition, the photodetector may be produced as one of an array of elements.

In some embodiments of the invention, the insert thickness is at least an order of magnitude thinner than the host separation thickness. The host separation thickness may be at least 10 monolayers, e.g., greater than 55 Angstroms. In addition, in further embodiments of the invention, the host separation thickness may stepwise increase along a growth direction of the host semiconductor material. The host semiconductor material may comprise InAsSb and the insert semiconductor material of the plurality of insert layers may comprise InSb.

In a similar manner, a typical method embodiment of the invention of growing an absorber layer for a photodetector, comprises growing a plurality of host layers comprising a host semiconductor material, and inserting periodically an insert semiconductor material into the host semiconductor material as the host semiconductor material is grown such that a plurality of insert layers are interleaved with at least some of the plurality of host layers each having a host separation thickness therebetween, each of the plurality of insert layers having an insert thickness. The insert thickness is two monolayers or less and significantly less than the host separation thickness. The host semiconductor material and the insert semiconductor material may have substantially mismatched lattice constants. The method embodiment of the invention may be further modified consistent with the apparatuses described herein.

Another embodiment of the invention comprises a photodetector, having a substrate layer, an absorber layer, a barrier layer grown on the absorber layer, and a contact layer. The absorber layer comprises a host semiconductor material grown as a plurality of host layers on the substrate layer, and an insert semiconductor material periodically inserted as a plurality of insert layers interleaved with at least some of the plurality of host layers each having a host separation thickness therebetween as the host semiconductor material is grown, each of the plurality of insert layers having an insert thickness. The insert thickness is two monolayers or less (e.g. typically 4 Angstroms or less) and significantly less than the host separation thickness. The host semiconductor material and the insert semiconductor material may have substantially mismatched lattice constants. This embodiment of the invention may be further modified consistent with the methods and apparatuses described herein.

BRIEF DESCRIPTION OF THE DRAWINGS

Referring now to the drawings in which like reference numbers represent corresponding parts throughout.

DETAILED DESCRIPTION OF THE PREFERRED EMBODIMENT

1. Overview

As previously mentioned, embodiments of the present invention are directed to a novel digital alloy absorber layer for semiconductor photodetectors which can increase the spectral response range and improve the mobility of the photo-generated carriers (e.g. in an nBn photodetector or a p-n photodetector). A digital alloy absorber embodiment of the invention can employ one (or fraction thereof) to several monolayers of a semiconductor (insert layers) periodically embedded into a different host semiconductor material of the absorber layer. The semiconductor material of the insert layer(s) and the host semiconductor material may have lattice constants that are substantially mismatched. The described technique simultaneously allows for control of alloy composition and net strain, which are both key parameters for the photodetector operation.

In an nBn photodetector, the absorber is doped n-type, and therefore its photocarrier extraction property depends largely on hole transport. The hole mobility in a typical InAs/GaSb type-II superlattice is low, and therefore unfavorable for hole transport. One advantages of keeping the insert layers very thin (typically less than two monolayers) is that the insertion layers do not need to have lattice constant that are nearly lattice-matched to the host, thus allowing more flexibility in the choice of insert material. The other advantage is that while hole mobilities are typically substantially reduced in structures with relatively thick (e.g., 5 or more monolayers) insert layers, they are not in structures with very thin insert layers.

Although embodiments of the present invention are primarily described herein with respect to nBn photodetectors, those skilled in the art will appreciate that the novel absorber layer may be applied to any other types as well. For example, a pBn, a double heterostructure (DH), or any other photodetector which uses a similar absorber layer may be implemented.

2. Infrared Detectors and Digital Alloy Absorber

Figure 1A:
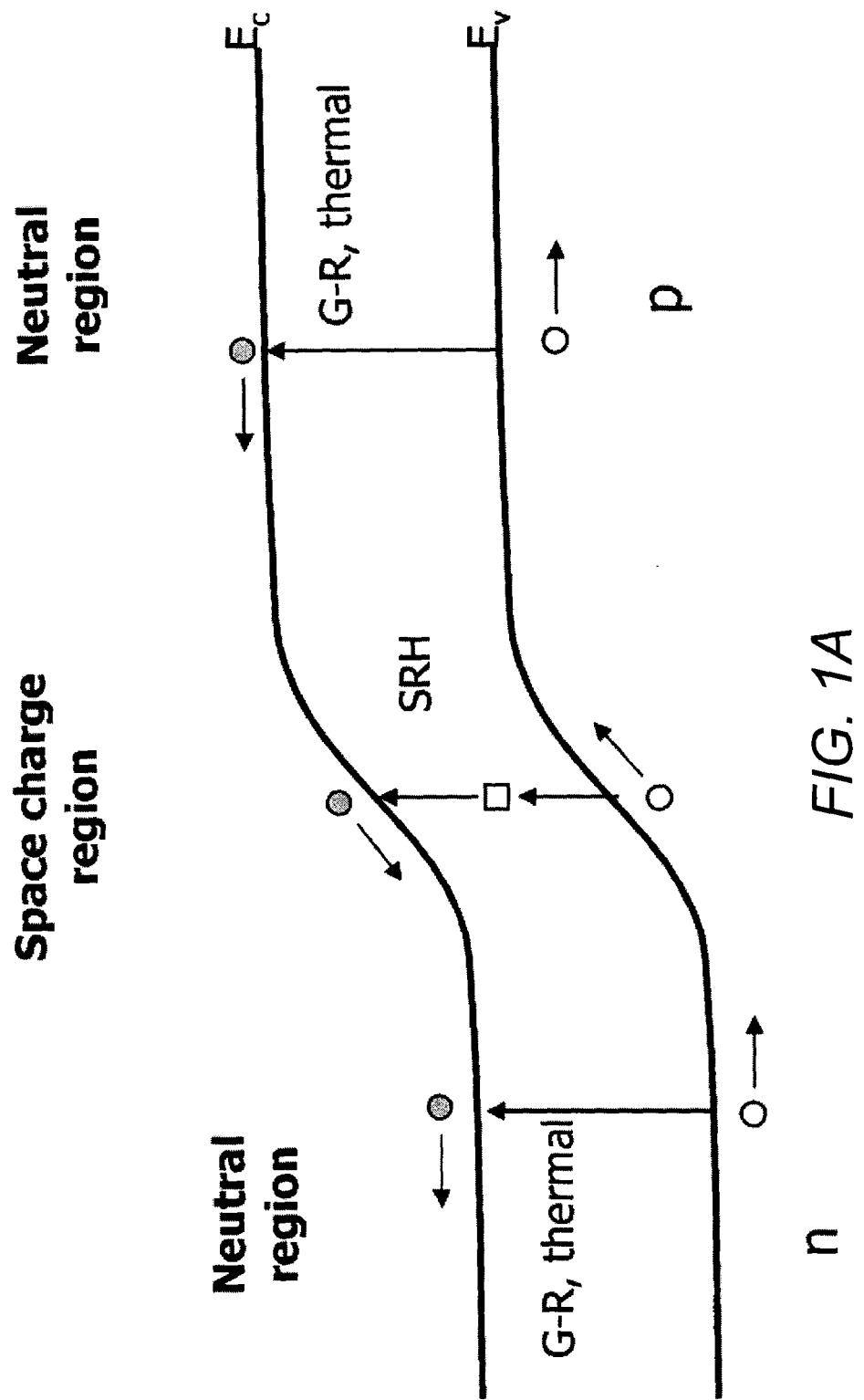
FIGS. 1A and 1B are schematic energy band diagrams showing exemplary conduction and valence band edges of a p-n photodiode and an nBn photodetector, respectively.
Figure 1B:
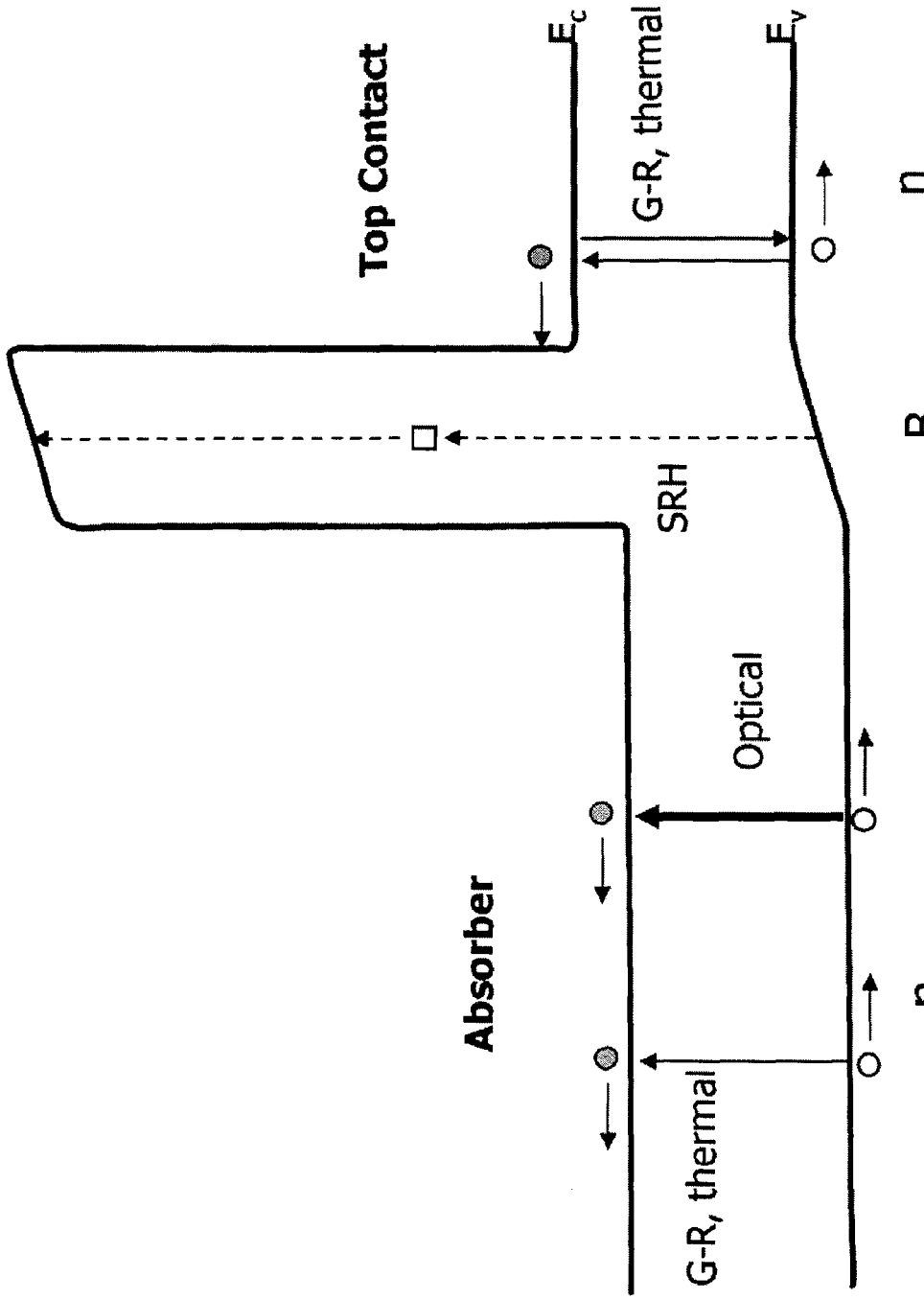

FIGS. 1A and 1B are schematic energy band diagrams showing exemplary conduction and valence band edges of a p-n photodiode and an nBn barrier infrared detector, respectively. The energy band diagram of a typical barrier photodetector structure shown in FIG. 1B has a lightly n-doped IR absorber layer region, a barrier layer, and an n-doped top contact layer. It resembles the energy band diagram of a typical p-n photodiode shown in FIG. 1A, except that the n-type absorber layer region is now doped lightly n-type, the junction (space charge region) is replaced by a specially designed wide-gap barrier layer (B), and that the p-contact layer is replaced by an n-contact layer. The unique characteristics of the barrier infrared detectors result from heterostructures that contain specially designed barrier layers which can block one type of carrier (either electrons or holes) but at the same time allow the unimpeded flow of the other type of carrier. It is important to note is that the barrier layer does not block the flow of photo-generated electrons or holes in the absorber layer. FIG. 1B shows that photogenerated electrons and holes in the absorber layer can flow to the left and the right, respectively; neither is blocked by the barrier layer. However, the barrier layer is highly effective at blocking dark current. Reducing dark current (noise) without impeding photocurrent (signal) is the key to the success of the barrier infrared detector design.

Dark current reduction is an important objective in order to achieve high-performance in infrared detectors. Reducing dark current (noise) increases D* (specific detectivity; a measure of signal-to-noise ratio), and leads to higher detector operating temperature and/or sensitivity. Modern high-performance infrared detectors are typically based on the p-n junction design, as illustrated above in FIG. 1A. In a p-n diode, the major performance-limiting dark current mechanisms are: (1) surface leakage current, (2) diffusion dark current, and, (3) generation-recombination (G-R) dark current. Surface leakage currents could typically be suppressed by passivation and/or planar process techniques. The diffusion dark current comes mainly from thermally generated minority carriers from quasi-neutral regions outside the junctions, and is proportional to $\exp(-E_g/kT)$, where $E_g$ is the energy band gap of the detector absorber material. G-R dark currents come from band-to-band radiative, Auger (carrier scattering), and Shockley-Read-Hall (SRH) processes. While radiative and Auger processes are fundamental, occurring even in the absorber region, the SRH process, which occurs in the depletion regions surrounding the junction, is due to crystal defects and impurity energy levels within the energy band gap. The SRH dark current is proportional to $\exp(-E_g/2kT)$, and is often the dominant dark current source, particularly at lower temperatures. Therefore, it is highly desirable to eliminate SRH dark current, either by reducing surface and bulk defects or through device design. Dark current performance is then governed by the more fundamental mechanisms.

An important infrared detector design element for dark current reduction is the use of semiconductor heterostructures. In this regard, the barrier infrared detector approach has proven to be highly effective. In a p-n junction, as illustrated in FIG. 1A, dropping bias over the junction (space charge region) inevitably creates unwanted G-R dark current due to SRH processes. Under typical operating conditions, nBn structure is biased slightly for hole collection at the top contact layer, as illustrated in FIG. 1B. Most of the applied bias drops over the barrier region, for which the SRH dark current is almost totally suppressed because of the much wider band gap (recall SRH dark current is proportional to $\exp(-E_g/2kT)$, and is suppressed when $E_g$ is large). The barrier also serves to block the flow of electrons (the majority carrier) dark current from the top contact layer; the electrons blocked by the barrier layer eventually recombine with the thermally generated holes so that there is no net diffusion dark current from the contact layer. This mechanism is very significant for dark current suppression at higher temperatures, where diffusion dark current becomes important. In addition, when used in conjunction with a planar manufacturing process, the wide band gap barrier prevents surface recombination and serves to suppress surface leakage current.

Dark current suppression results in increased signal-to-noise ratio at a given temperature, or, alternatively, higher operating temperature with the same S/N ratio in a barrier infrared detector. As a result of these dark current reduction mechanisms, a barrier infrared detector can exhibit breakthrough performance. The key innovation for embodiments of the present invention is employing a digital alloy in the absorber layer. This novel absorber layer may be employed to reduce a bandgap of the absorber layer and thereby extend the wavelength cutoff, e.g. up to 5 µm or more.

In addition, effects of the periodic structure of the described digital alloy absorber may reduce the bandgap (resulting in a longer cutoff wavelength). In fact, it is important note that an absorber layer comprising a homogeneous mixture of identical semiconductor materials and composition that might otherwise be used in a novel digital alloy absorber as described herein has exhibited a higher bandgap than was achieved employing those materials in the novel digital alloy absorber structure. Thus, surprisingly the novel digital alloy absorber structure alone is responsible for some bandgap reduction beyond that afforded by wider range of semiconductor materials that may be combined, i.e. including lattice mismatched semiconductor materials between the host and insert.

Figure 1C:
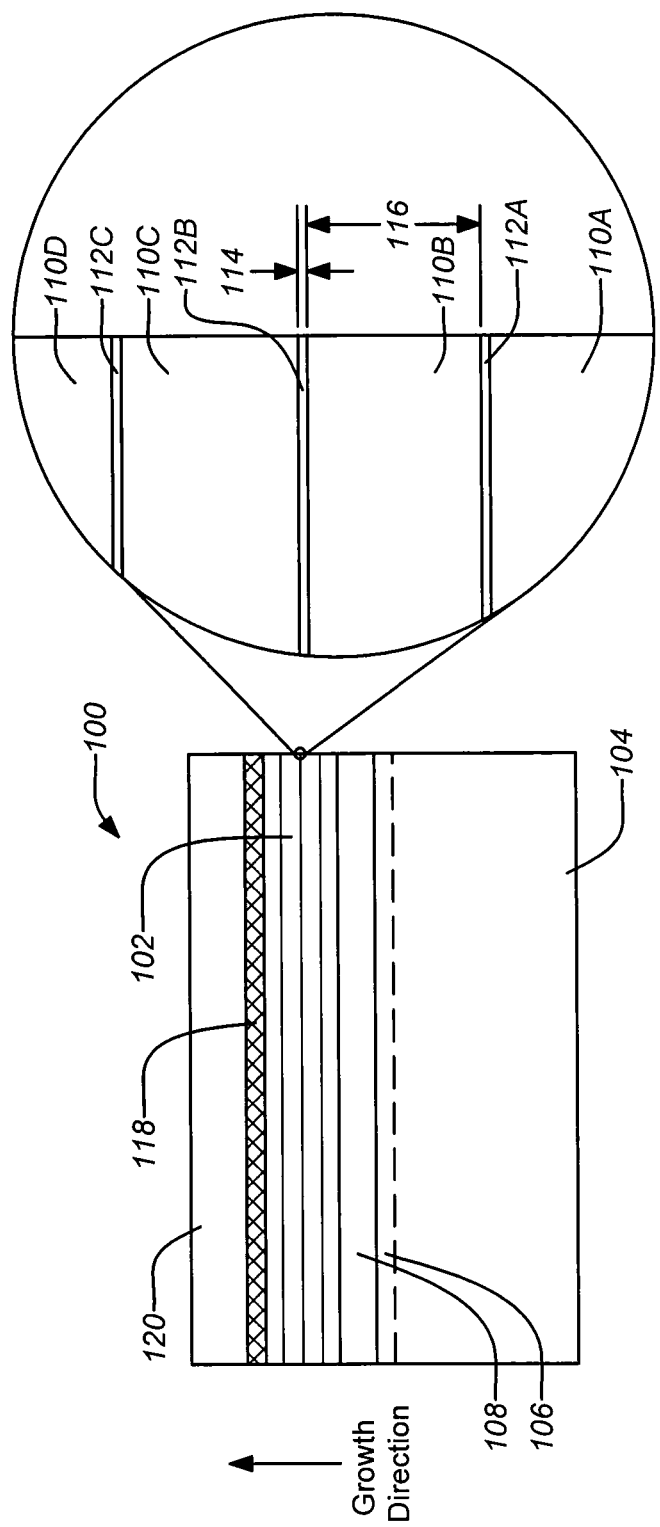
FIG. 1C is a schematic diagram of a digital alloy absorber layer for a photodetector in accordance with an embodiment of the invention.

FIG. 1C is a schematic diagram of a digital alloy absorber layer 102 for a generalized photodetector 100 (such as a barrier photodetector) in accordance with an embodiment of the invention. In general, the absorber layer 102 is grown on a substrate layer 104, e.g. GaSb, and then a barrier layer 118 is grown on top of the absorber layer 102. Following this, a top contact layer 120 may be grown on the barrier layer 118. It should be noted that it is well known in the art that the substrate layer 104 has its surface prepared for subsequent semiconductor layers through the growth of a buffer layer 106, which may be of the same material as the substrate layer 104 (e.g. GaSb) or some other material appropriate for the next layer to be grown. Thus, as used in the present disclosure, the substrate layer 104 is deemed to include any necessary buffer layer 106.

In addition, in some photodetector structures another intervening layer 108 may be grown on the substrate layer 104 (including the buffer layer 106) depending on the device. For example, the optional intervening layer 108 may be either a bottom contact layer or an additional barrier layer. Examples of specific device structures are described in the following section. Thus, as used in the present disclosure, "an absorber layer 102 grown on a substrate layer 104" indicates that the absorber layer 102 is grown on a supporting substrate layer 104 which may be either, directly on the substrate layer 104 (which includes a buffer layer 106), or on the substrate layer 104 with an intervening layer 108 therebetween.

Although FIG. 1C is not a scaled drawing, the detailed structure of the novel absorber layer is shown in the zoomed view circular inset on the right. Here, the novel absorber layer 102 of the photodetector 100 is shown to comprise a plurality of host layers 110A-110D of a host semiconductor material (e.g. InAsSb) separated by insert layers 112A-112C of an insert semiconductor material (e.g. InSb) as the host semiconductor material is grown. Including the insert 112A-112C layers effectively reduces a bandgap of the absorber layer 102 from what it would be with only the host material. Thus, the insert semiconductor material is periodically inserted to yield the plurality of insert layers 112A-112C interleaved with at least some of the plurality of host layers 110A-110D each having a host separation thickness 116 therebetween. Each of the plurality of insert layers 112A-112C has an insert thickness 114. The host semiconductor material is lattice matched to the material of the underlying substrate layer 104 in order to limit strain in the structure. However, the relative difference between the insert thickness 114 and the host separation thickness 116 (i.e., the insert thickness is significantly less than the host separation thickness) allows the host semiconductor material and the insert semiconductor material to have substantially mismatched lattice constants. For example, a host semiconductor material of InAsSb has a lattice constant closely matched to that of a GaSb substrate (i.e. 6.1 Angstroms), whereas an insert semiconductor material of InSb having a lattice constant of 6.48 Angstroms is substantially mismatched to that of the InAsSb host semiconductor material.

The typical absorber layer 102 is developed with a large number of periods of repeating host layers 110A-110C and insert layers 112A-112C. (One period is one host layer and one insert layer.) For example, the substrate layer 104 may be 500 microns thick, whereas an example absorber layer 102 may be only 5 microns thick grown with the periodic host-insert layer structure. Each period of the 5 micron absorber layer 102 may comprise a 60 Angstrom host layer and a 3 Angstrom insert layer thereon. Thus, the example absorber layer 102 would include approximately 8,000 periods in total. As discussed above, the relative difference between the host separation thickness 116 and the insert thickness 114 allows for the substantially mismatched lattice constants of the host and insert materials. In general, the insert thickness may be at least an order of magnitude thinner than the host separation thickness. Typically, the insert thickness may be less than 4 Angstroms and the host separation thickness may be greater than 55 Angstroms. The insert thickness 114 may also be defined in terms of monolayers of the insert semiconductor material. For example, the insert layers may be fractions of a monolayer up to several monolayers thick. In some embodiments of the invention, the digital alloy absorber layer 102 may be designed to deliver a graded bandgap.

Figure 1D:
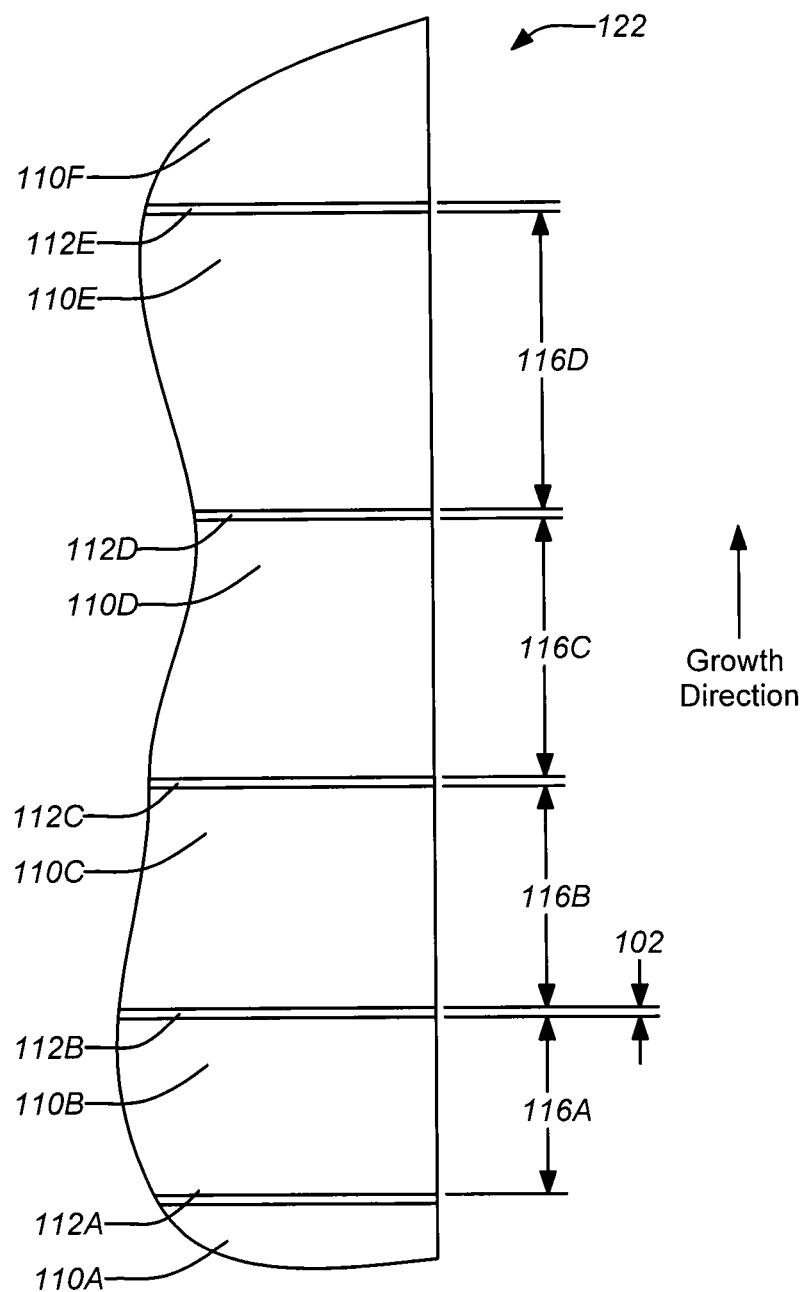
FIG. 1D is a schematic diagram of a digital alloy absorber layer with a stepwise increasing host separation thickness to yield a graded bandgap for a photodetector in accordance with an embodiment of the invention.

FIG. 1D is a schematic diagram of a digital alloy absorber layer 102 with a stepwise increasing host separation thickness 116A-116D for a photodetector 100 to yield a graded bandgap in accordance with an embodiment of the invention. FIG. 1D shows only another zoomed view of an alternate absorber layer 122 which may replace absorber layer 102 in the photodetector 100 of FIG. 1C. In this case, the host separation thickness 116A-116D is increased in a stepwise manner along a growth direction of the host semiconductor material. The effect of the stepwise variation of the host separation thickness 116A-116D across the different host layers 110A-110F of the overall absorber layer 122 is to effectively yield a graded bandgap. This is because the high number of host layers typically used (e.g. 8,000). The rate of change of the host separation thickness 116A-116D across the different host layers 110A-110F of the overall absorber layer 122 may be varied depending upon the desired bandgap grade. (The use of a bandgap grade in a photodetector design is discussed in the next section.) In general, however, the insert thickness 112A-112E across the overall absorber layer 122 remains constant.

Finally, those skilled in the art will appreciate that other semiconductor material combinations may be employed remaining consistent with these principles. For example, an InAsSb host semiconductor material may be used with a GaAs insert semiconductor material on a GaSb substrate. In other examples the photodetector 100 may be developed on an InAs substrate. Some example, photodetector structures which may employ the described absorber layer 102 are detailed in the next section.

3. Exemplary Infrared Detector with Digital Alloy Absorber

Figure 2A:
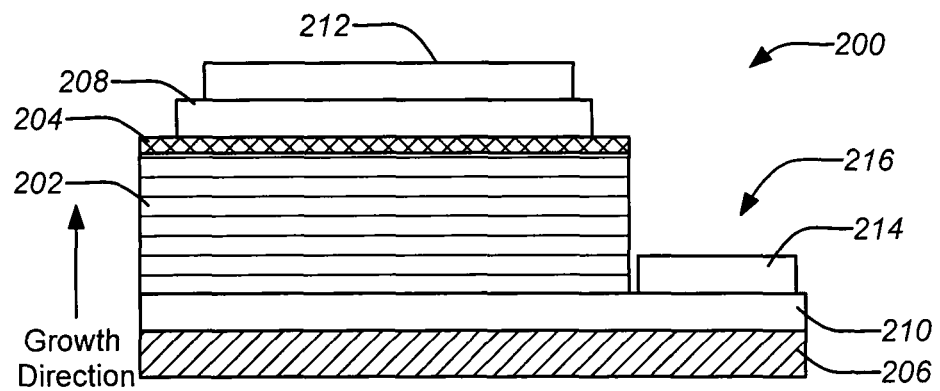
FIG. 2A illustrates an exemplary barrier infrared detector embodiment with a bottom contact layer disposed between the substrate layer and the absorber layer and a metal contact deposited on an exposed bottom contact area.

FIG. 2A illustrates an exemplary barrier infrared detector embodiment with a bottom contact layer disposed between the substrate layer and the absorber layer and a metal contact deposited on an exposed bottom contact area. The device 200 shows an nBn structure comprising an infrared absorber layer 202 and an adjacent barrier layer 204 inserted in the device to suppress dark current. The absorber layer 202 includes a plurality of host layers of a host semiconductor material (e.g. InAsSb) separated by insert layers of an insert semiconductor material (e.g. InAs) as previously described in the absorber layer 102 of FIG. 1C and alternately the absorber layer 122 of FIG. 1D.

Typically, the absorber layer 202 may be a few microns (e.g., approximately 5 to 6 microns) in thickness, while the barrier layer 204 is much thinner. The barrier layer 204 may be only a few hundred nanometers thick, e.g. 200 nm. In some embodiments, the absorber may include a stepwise increase in the host separation thickness to yield a graded bandgap and/or the barrier mixing ratio may be varied along the growth direction of the layers (indicated by the arrow in the figure) as will be described hereafter with reference to FIGS. 3A to 3C. See U.S. patent application Ser. No. 12/567,635, filed Sep. 25, 2009 by Ting et al., and entitled "HIGH OPERATING TEMPERATURE BARRIER INFRARED DETECTOR WITH TAILORABLE CUTOFF WAVELENGTH," which is incorporated by reference herein, for a description of varying composition to yield a graded barrier layer. Typically, the top contact layer may be n-doped. However, the top contact layer may comprise doping differing from that of the absorber layer host material.

In the exemplary device 200, the absorber layer 202 and barrier layer 204 are bounded electrically by a bottom contact layer 210 and a top contact layer 208. The top and bottom contact layers 208, 210 provide suitable areas for deposition of top and bottom metal contacts 212, 214 for electrical connection of the device 200. The top contact layer 208 may be grown on the barrier layer 204 with the top metal contact 212 deposited thereon. The bottom contact layer 210 may be grown on the substrate layer 206 (to be disposed between the substrate layer 206 and the absorber layer 202 after the absorber layer 202 is grown on it). A bottom metal contact 214 may then be deposited on an exposed bottom contact area 216. The bottom contact area 216 may be exposed by etching as will be understood by those skilled in the art. It should be noted that embodiments of the invention may employ any known alternate contact layer and metal contact designs.

Figure 2B:
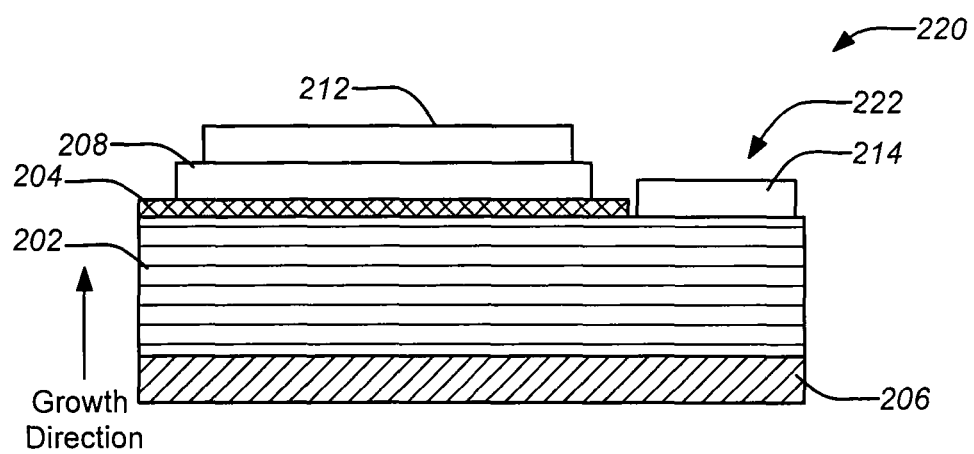
FIG. 2B illustrates an exemplary barrier infrared detector embodiment with a metal contact deposited on an exposed absorber area of the absorber layer.

FIG. 2B illustrates an exemplary barrier infrared detector device 220 with a metal contact deposited on an exposed absorber area of the absorber layer. In general the device 220 functions in the same manner and with the same elements as the device 200 described in FIG. 2A. However, in this case, the bottom contact layer 210 is eliminated and a bottom metal contact 214 is deposited directly on an exposed absorber area 222 of the absorber layer 202 of the device 220. Electrical connection to the absorber layer 202 is provided through this alternate technique. Here also, the absorber layer 202 includes a plurality of host layers of a host semiconductor material (e.g. InAsSb) separated by insert layers of an insert semiconductor material (e.g. InAs) as previously described in the absorber layer 102 of FIG. 1C and alternately the absorber layer 122 of FIG. 1D.

Figure 2C:
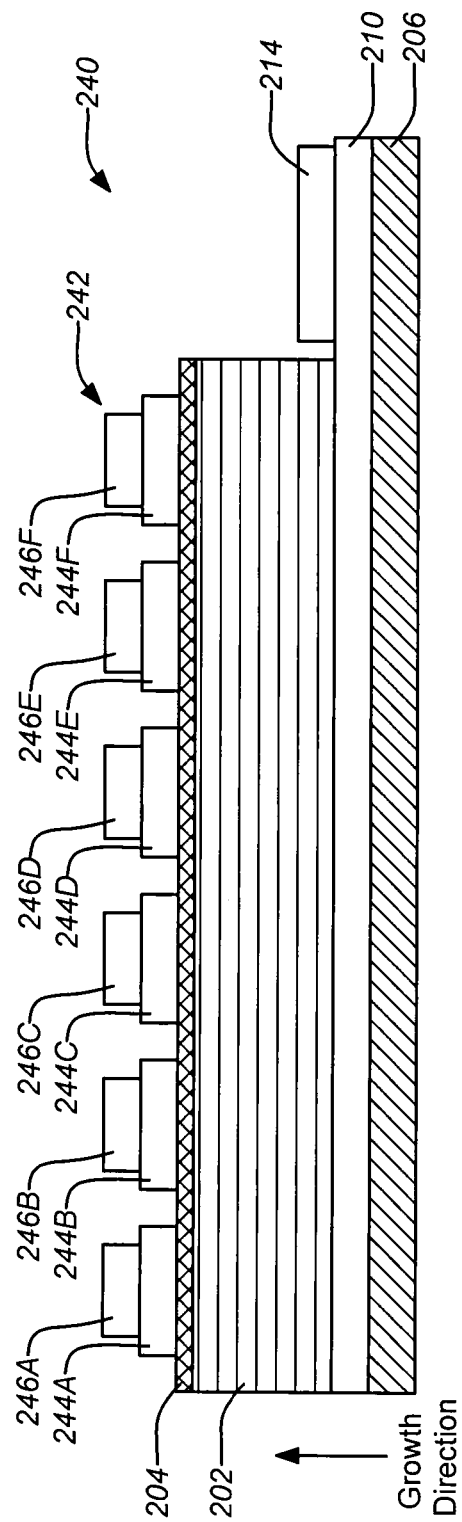
FIG. 2C illustrates an exemplary barrier infrared detector embodiment of the invention comprising an array of elements.

FIG. 2C illustrates an exemplary barrier infrared detector device 240 comprising an array of elements. In general the device 220 functions in the same manner and with the same elements as the device 200 described in FIG. 2A. In this case, however, the top contact layer 208 is isolated into an array 242 of elements 244A-244F. Isolation of the array may be achieved by etching the grown top contact layer or by any other known technique. Separate metal contacts 246A-246F may then be deposited on each element 244A-244F of the array 242 of the top contact layer. The array 242 of elements 244A-244F forms electrically isolated individual functional detectors between their separate metal contacts 246A-246F and the common bottom metal contact 214 that may be used in a detector array, imaging array, or focal plane array as will be understood by those skilled in the art. It should be noted that the array device 240 is shown having a bottom metal contact 214 design of the device 200 of FIG. 2A, however, bottom contact layer 210 and bottom metal contact 214 design of the device 220 of FIG. 2B may also be employed with the array device 204 as will be appreciated by those skilled in the art. As with the previous detectors 200, 220 of FIGS. 2A & 2B, the array detector 240 also operates with an absorber layer 202 that includes a plurality of host layers of a host semiconductor material (e.g. InAsSb) separated by insert layers of an insert semiconductor material (e.g. InAs) as previously described in the absorber layer 102 of FIG. 1C and alternately the absorber layer 122 of FIG. 1D.

The example detectors 200, 220, 240 may be further enhanced through additional and/or alternate components and architectures consistent with the described parameters and any known techniques of semiconductor device manufacture, and particularly known photodetector semiconductor devices including known barrier infrared detectors, as will be understood by those skilled in the art. In a similar manner, embodiments of the invention may employ any known materials and architectures for the various layers, e.g. contact layers, typical of any other known barrier infrared detectors as will be understood by those skilled in the art.

Figure 3A:
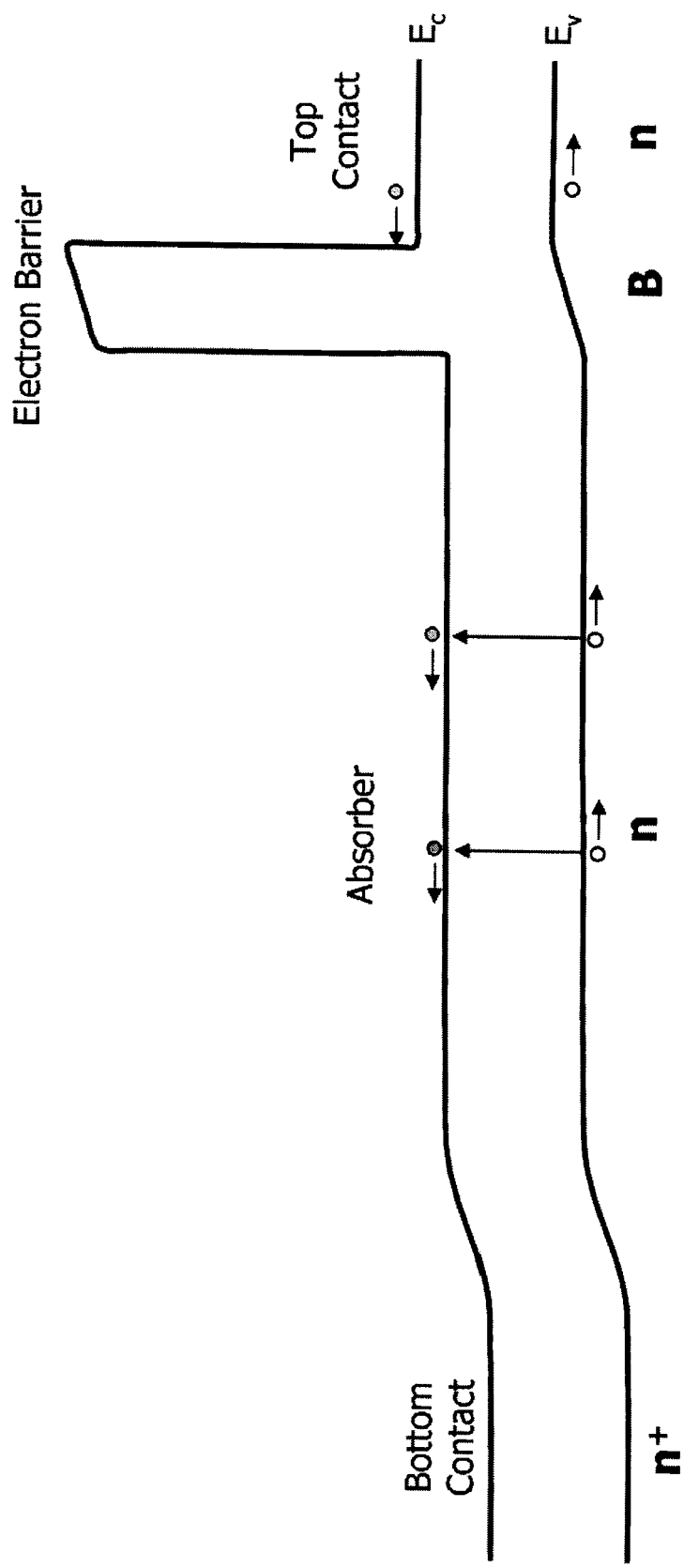
FIG. 3A is a schematic energy band diagram showing exemplary conduction and valence band edges for an exemplary barrier infrared detector.

FIG. 3A is a schematic energy band diagram showing exemplary conduction and valence band edges for the exemplary barrier infrared detector. This is similar to the more generalized energy band diagram of FIG. 1B. The energy bands are shown across the bottom contact layer, followed by a lightly n-doped IR absorber layer, a barrier layer, and an n-doped top contact layer. The barrier layer is carefully designed to suppress dark currents (noise) without impeding the flow of electron or hole photocurrent (signal). Note that the substrate layer 206 of the device 200 is typically not identified as an element of the energy band diagram as known in the art. (The substrate layer 206 is essentially irrelevant to the infrared detection operation of the device.)

A exemplary high operating temperature barrier infrared detector embodiment of the invention (e.g. as illustrated in FIG. 3A) employs a matching pair of absorber layer and barrier layer materials having valence band edges (Ev) being approximately the same to allow unimpeded hole flow, while conduction band edges (Ec) exhibit a large difference to form an electron barrier. In addition, the absorber layer host and barrier layer materials should have a substantially similar lattice constant, which should also match the lattice constant of the substrate layer material they are grown on to ensure high material quality and low defect density.

Figure 3B:
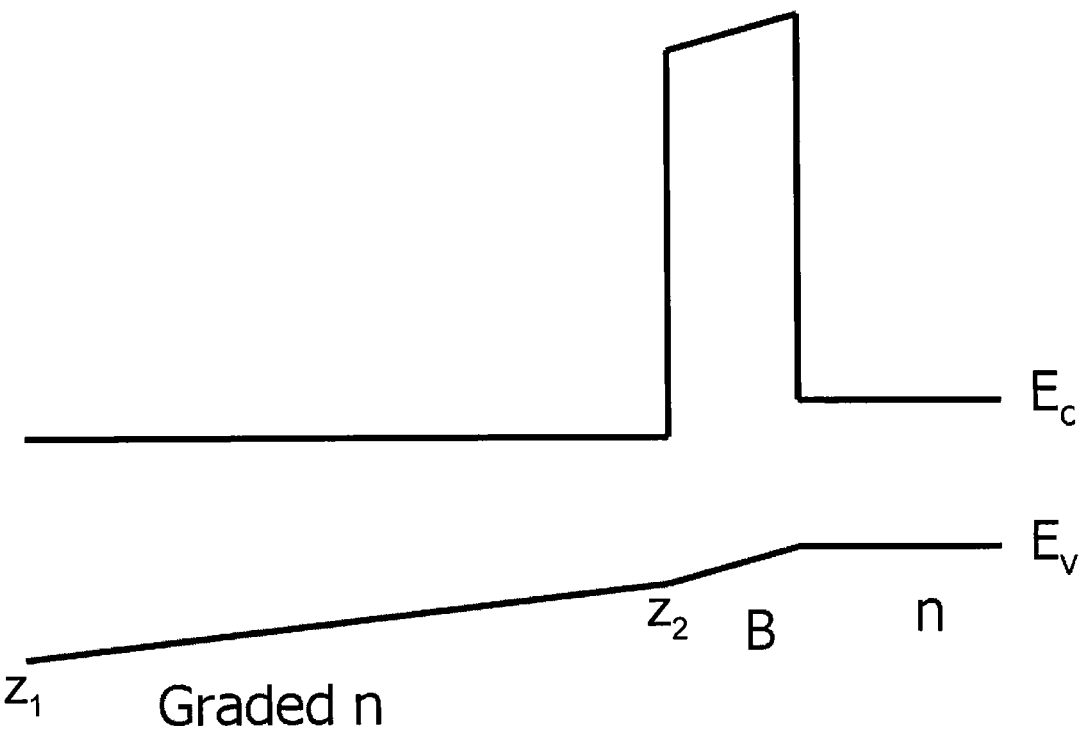
FIG. 3B is a schematic energy band diagram showing conduction and valence band edges for an exemplary barrier infrared detector with a graded gap absorber layer.

An absorber layer with a stepwise increasing host separation thickness along the growth direction may be used in an nBn detector to provide a graded bandgap, as illustrated by the transition from $z_1$ to $z_2$ in FIG. 3B. The energy band diagram in FIG. 3B shows an nBn detector with such a graded bandgap absorber layer, created by stepwise increasing host separation thickness along the growth direction (as illustrated in FIG. 1D). The advantage of such a structure is that the graded bandgap acts as a quasi electric field which serves to move the holes towards the top contact layer.

Figure 3C:
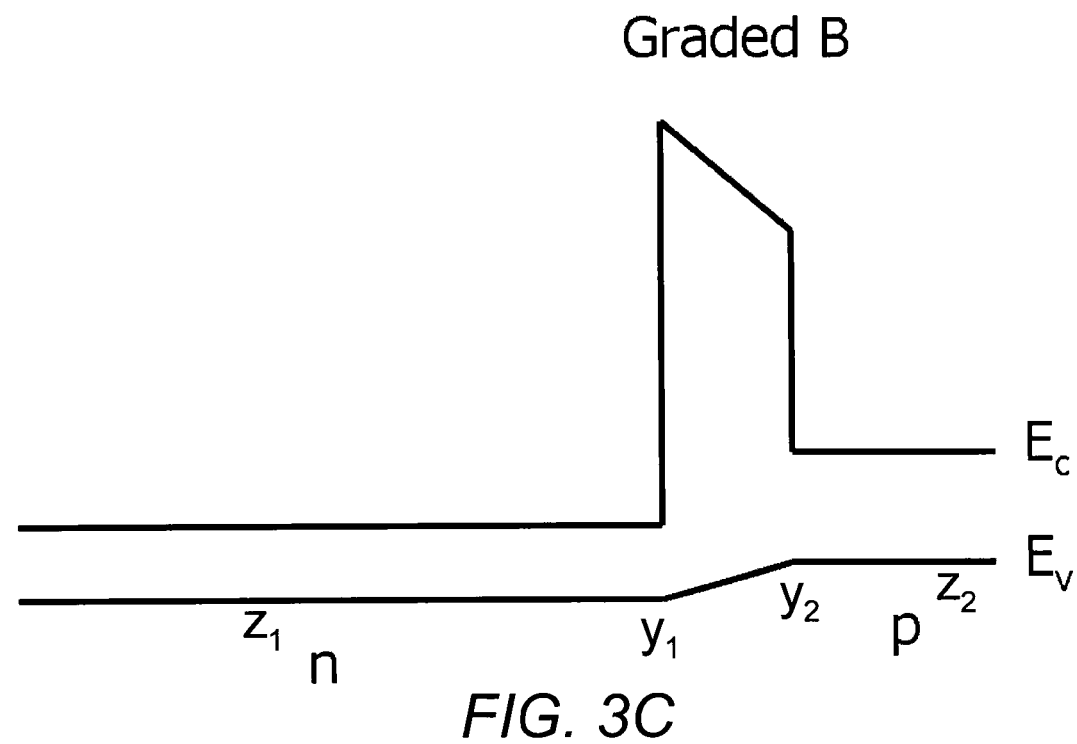
FIG. 3C is a schematic energy band diagram showing conduction and valence band edges for the exemplary barrier infrared detector with the absorber layer and the top contact layer having different band gaps and different doping types, connected by a graded-gap barrier layer.

In one embodiment of the device structure, the top contact layer may be made from GaInAsSb alloys. In another embodiment of the device structure, the absorber host and the top contact layer may have different doping types. In yet another embodiment, the composition of the barrier layer could vary along the growth direction. FIG. 3C illustrates a device structure with all of the above mentioned characteristics. For example, the absorber layer host may be a doped n-type, while the top contact layer is doped p-type. Further, the barrier layer composition may vary along the growth direction from $y_1$ to $y_2$. Note that the varying the composition of the barrier layer is performed to create a smooth transition between the valence band edges of the absorber layer and the top contact layer, as illustrated by the transition from $y_1$ to $y_2$ in FIG. 3C.

4. Producing a Digital Alloy Absorber for a Infrared Detector

Embodiments of the invention also encompass a method of producing a digital alloy absorber layer in an infrared detector device. As discussed above, the device may be tailored to have a desired cutoff wavelength, e.g. up to at least 5 microns.

Figure 4:
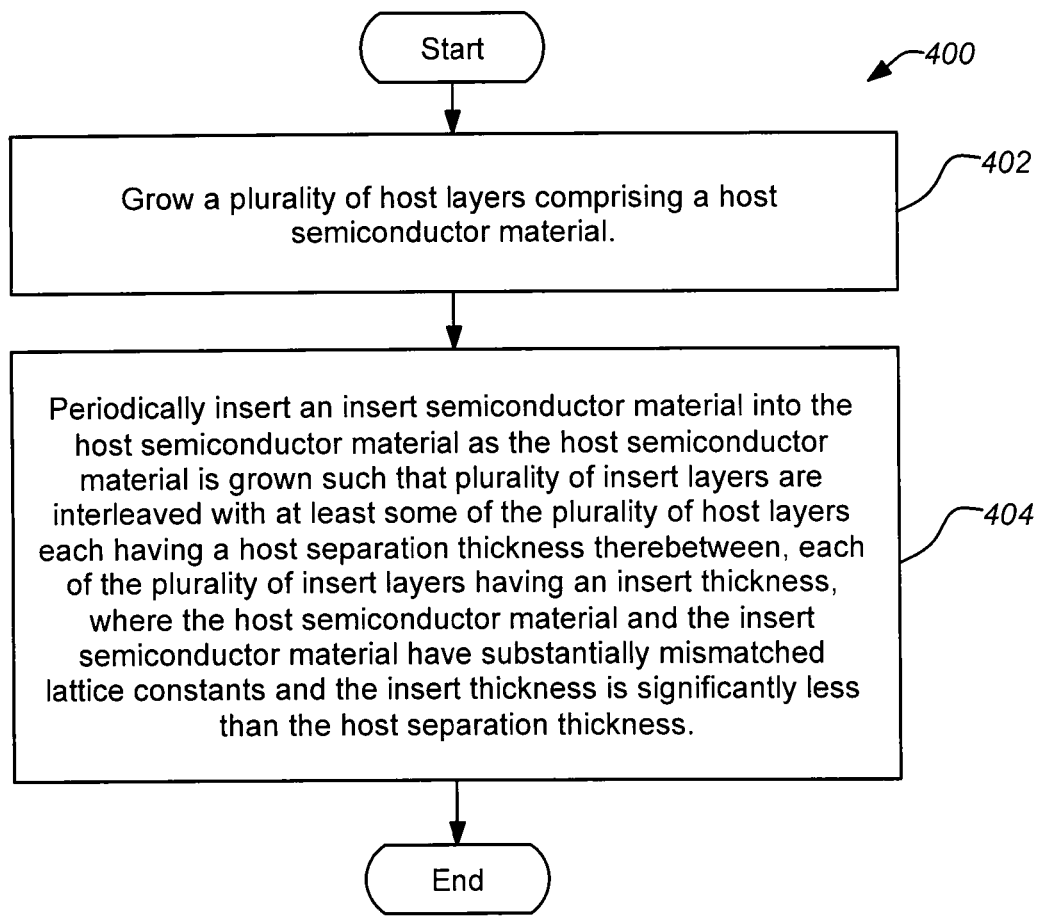
FIG. 4 is a flowchart of an exemplary method of producing an absorber layer for a photodetector.

FIG. 4 is a flowchart of an exemplary method 400 of producing an absorber layer for a photodetector detector. The method 400 begins with an operation 402 of growing a plurality of host layers comprising a host semiconductor material. In operation 404, an insert semiconductor material is periodically inserted into the host semiconductor material as the host semiconductor material is grown such that plurality of insert layers are interleaved with at least some of the plurality of host layers each having a host separation thickness therebetween, each of the plurality of insert layers having an insert thickness. The host semiconductor material and the insert semiconductor material have substantially mismatched lattice constants and the insert thickness is significantly less than the host separation thickness. It is important to note that growing an individual host layer and then an insert layer are performed sequentially and repeatedly to develop the overall absorber. However, operation 402 and 404 (which each separately define growing the plurality of host layers and inserting a plurality of insert layers overall) are essentially performed simultaneously as will be appreciated by those skilled in the art. The method 400 may be further enhanced through optional operations consistent with the described parameters and any known techniques of semiconductor device manufacture as will be understood by those skilled in the art.

In addition, methods for producing specific photodetector devices may include method 400 only for developing the digital alloy absorber layer. For example, to produce an example barrier photodetector, a GaSb or InAs substrate may first be provided. An appropriate buffer layer is then grown on the substrate to prepare the surface for the digital alloy absorber layer, e.g. matching the host semiconductor material. (An optional lower contact layer or barrier layer may be grown on the buffer layer, depending on the device.) Then the absorber layer is produced per the method 400 described. Following this, a barrier layer is grown on the absorber layer (e.g. an AlGaAsSb layer where Ga and As concentrations may be varied to optimize performances). Finally, a conductive top contact layer may be grown on the barrier layer. Metal contacts for operating the device may then be added (e.g. on the top contact layer and either an exposed region of a lower contact layer or the absorber layer.

This concludes the description including the preferred embodiments of the present invention. The foregoing description including the preferred embodiment of the invention has been presented for the purposes of illustration and description. It is not intended to be exhaustive or to limit the invention to the precise forms disclosed. Many modifications and variations are possible within the scope of the foregoing teachings. Additional variations of the present invention may be devised without departing from the inventive concept as set forth in the following claims.

What is claimed is:

1. An absorber layer for a photodetector, comprising:
a host semiconductor material grown as a plurality of host layers; and
an insert semiconductor material periodically inserted as a plurality of insert layers interleaved with at least some of the plurality of host layers each having a host separation thickness therebetween as the host semiconductor material is grown, each of the plurality of insert layers having an insert thickness;
wherein the insert thickness is two monolayers or less and less than the host separation thickness, a barrier layer for blocking one carrier type from the absorber layer while allowing flow of another carrier type is grown on the absorber layer, and the absorber layer is grown directly on a buffer layer that is grown directly on a substrate layer and the buffer layer and the substrate layer are of the same material; and
wherein the host semiconductor material and the insert semiconductor material have substantially mismatched lattice constants and the host semiconductor material, the substrate layer, and the barrier layer have lattice constants sufficiently similar to yield pseudomorphic growth.

2. The absorber layer of claim 1, wherein the host separation thickness is at least 10 monolayers.

3. The absorber layer of claim 1, wherein the photodetector comprises a barrier photodetector.

4. The absorber layer of claim 1, wherein the photodetector is one of an array of elements.

5. The absorber layer of claim 1, wherein the host semiconductor material comprises InAsSb.

6. The absorber layer of claim 1, wherein the insert semiconductor material of the plurality of insert layers comprises InSb.

7. The absorber layer of claim 1, wherein the insert thickness is at least $1/10$ thinner than the host separation thickness.

8. The absorber layer of claim 1, wherein the host separation thickness stepwise increases along a growth direction of the host semiconductor material in order to yield a graded bandgap of the absorber layer.

9. A method of growing an absorber layer for an nBn photodetector, comprising:
growing a plurality of host layers comprising a host semiconductor material; and
inserting periodically an insert semiconductor material into the host semiconductor material as the host semiconductor material is grown such that plurality of insert layers are interleaved with at least some of the plurality of host layers each having a host separation thickness therebetween, each of the plurality of insert layers having an insert thickness;
wherein the insert thickness is two monolayers or less and less than the host separation thickness, a barrier layer for blocking one carrier type from the absorber layer while allowing flow of another carrier type is grown on the absorber layer and the absorber layer is grown directly on a buffer layer that is grown directly on a substrate layer and the buffer layer and the substrate layer are of the same material; and
wherein the host semiconductor material and the insert semiconductor material have substantially mismatched lattice constants and the host semiconductor material, the substrate layer, and the barrier layer have lattice constants sufficiently similar to yield pseudomorphic growth.

10. The method of claim 9, wherein the insert thickness is at least $1/10$ thinner than the host separation thickness.

11. The method of claim 9, wherein the host separation thickness is at least 10 monolayers.

12. The method of claim 9, wherein the photodetector comprises a barrier photodetector.

13. The method of claim 9, wherein the photodetector is one of an array of elements.

14. The method of claim 9, wherein the host semiconductor material comprises InAsSb.

15. The method of claim 9, wherein the insert semiconductor material of the plurality of insert layers comprises InSb.

16. The method of claim 9, wherein the host separation thickness stepwise increases along a growth direction of the host semiconductor material in order to yield a graded bandgap of the absorber layer.

17. A photodetector, comprising:
a substrate layer;
an absorber layer comprising a host semiconductor material grown as a plurality of host layers directly on a buffer layer that is grown directly on a substrate layer and the buffer layer and the substrate layer are of the same material, and an insert semiconductor material periodically inserted as a plurality of insert layers interleaved with at least some of the plurality of host layers each having a host separation thickness therebetween as the host semiconductor material is grown, each of the plurality of insert layers having an insert thickness;
a barrier layer grown on the absorber layer, the barrier layer for blocking one carrier type from the absorber layer while allowing flow of another carrier type; and
a top contact layer grown on the barrier layer;
wherein the insert thickness is two monolayers or less and less than the host separation thickness; and
wherein the host semiconductor material and the insert semiconductor material have substantially mismatched lattice constants and the host semiconductor material, the substrate layer, and the barrier layer have lattice constants sufficiently similar to yield pseudomorphic growth.

18. The photodetector of claim 17, wherein the insert thickness is at least $1/10$ thinner than the host separation thickness.

19. The photodetector of claim 17, wherein the host separation thickness is at least 10 monolayers.

20. The photodetector of claim 17, wherein the host separation thickness stepwise increases along a growth direction of the host semiconductor material in order to yield a graded bandgap of the absorber layer.

* * * * *